United States Patent
Bu et al.

(10) Patent No.: US 7,855,111 B2
(45) Date of Patent: Dec. 21, 2010

(54) BORDER REGION DEFECT REDUCTION IN HYBRID ORIENTATION TECHNOLOGY (HOT) DIRECT SILICON BONDED (DSB) SUBSTRATES

(75) Inventors: Haowen Bu, Plano, TX (US); Shaofeng Yu, Plano, TX (US); Angelo Pinto, San Diego, CA (US); Ajith Varghese, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/538,048

(22) Filed: Aug. 7, 2009

(65) Prior Publication Data
US 2010/0032727 A1 Feb. 11, 2010

Related U.S. Application Data

(63) Continuation-in-part of application No. 11/760,822, filed on Jun. 11, 2007, now Pat. No. 7,767,510.

(60) Provisional application No. 61/087,065, filed on Aug. 7, 2008.

(51) Int. Cl.
*H01L 21/8238* (2006.01)
*H01L 27/118* (2006.01)

(52) U.S. Cl. .................. 438/198; 438/199; 438/455; 438/479; 257/204; 257/E27.064; 257/E21.632

(58) Field of Classification Search .................. 438/199, 438/198, 406, 455, 479, 973; 257/E21.632, 257/204, 255, E27.064
See application file for complete search history.

(56) References Cited

U.S. PATENT DOCUMENTS

| 6,911,379 | B2 * | 6/2005 | Yeo et al. | 438/480 |
| 7,372,107 | B2 * | 5/2008 | Yeo et al. | 257/353 |
| 2004/0195646 | A1 * | 10/2004 | Yeo et al. | 257/527 |

\* cited by examiner

*Primary Examiner*—Lex Malsawma
(74) *Attorney, Agent, or Firm*—Warren L. Franz; Wade J. Brady, III; Frederick J. Telecky, Jr.

(57) ABSTRACT

Hybrid orientation technology (HOT) substrates for CMOS ICs include (100)-oriented silicon regions for NMOS and (110) regions for PMOS for optimizing carrier mobilities in the respective MOS transistors. Boundary regions between (100) and (110) regions must be sufficiently narrow to support high gate densities and SRAM cells. This invention provides a method of forming a HOT substrate containing regions with two different silicon crystal lattice orientations, with boundary morphology less than 40 nanometers wide. Starting with a direct silicon bonded (DSB) wafer of a (100) substrate wafer and a (110) DBS layer, NMOS regions in the DSB layer are amorphized by a double implant and recrystallized on a (100) orientation by solid phase epitaxy (SPE). Crystal defects during anneal are prevented by a low temperature oxide layer on the top surface of the wafer. An integrated circuit formed with the inventive method is also disclosed.

19 Claims, 6 Drawing Sheets

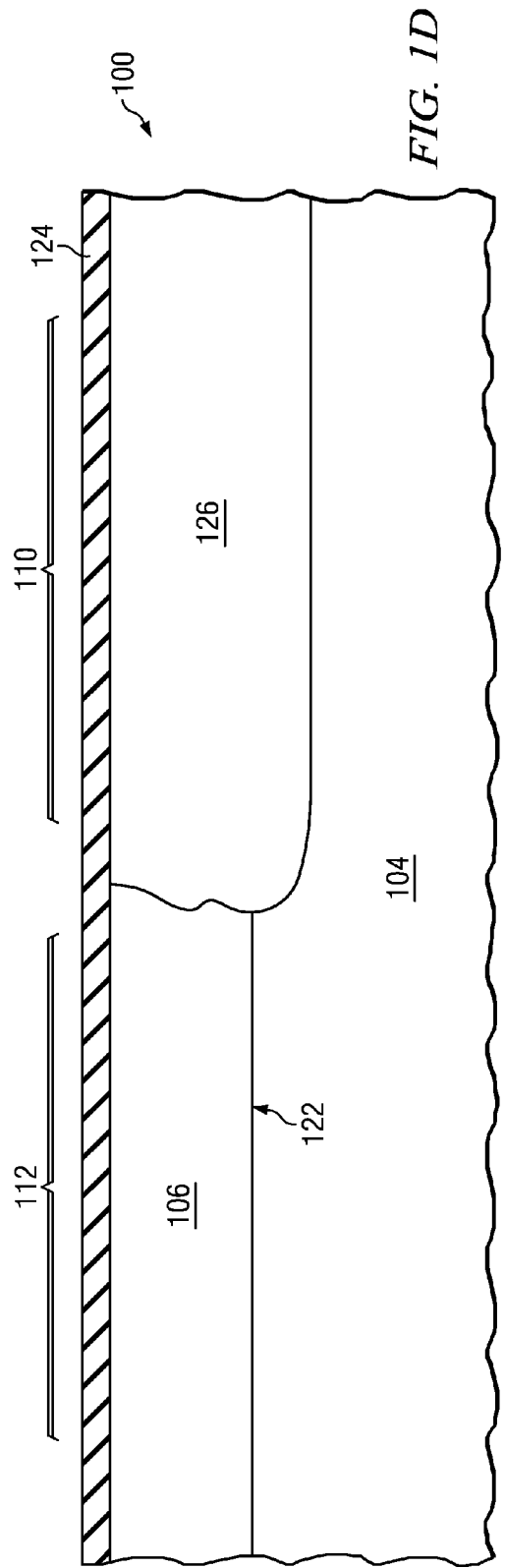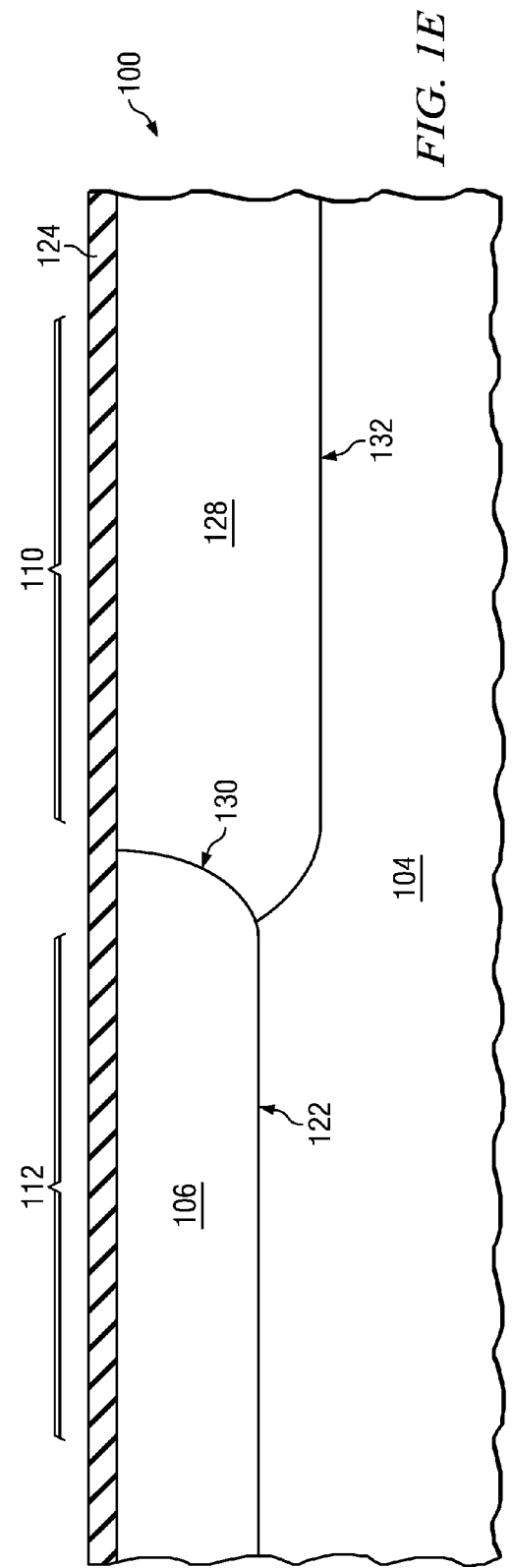

BORDER REGION DEFECT REDUCTION IN HYBRID ORIENTATION TECHNOLOGY (HOT) DIRECT SILICON BONDED (DSB) SUBSTRATES

This application is non-provisional of Application No. 61/087,065 filed Aug. 7, 2008, and is a continuation-in-part of application Ser. No. 11/760,822 filed Jun. 11, 2007, the entireties of both of which are incorporated herein by reference.

BACKGROUND

This invention relates to the field of integrated circuits. More particularly, this invention relates to methods to improve hybrid orientation substrates.

It is well recognized that increasing the mobility of charge carriers in metal oxide semiconductor (MOS) transistors in integrated circuits (ICs) improves the operating speed of ICs. There are several techniques used in advanced ICs to increase the mobilities of electrons and holes in silicon n-channel MOS (NMOS) and p-channel MOS (PMOS) transistors, including orienting the silicon substrate to take advantage of the fact that carrier mobility varies depending on the orientation of the crystal lattice in the MOS transistor channel. Electrons have maximum mobility in (100)-oriented silicon when the NMOS transistor is aligned on a [110] axis, that is, when the electron movement in the NMOS transistor channel is along a [110] direction. Holes have maximum mobility in (110)-oriented silicon when the PMOS transistor is aligned on a [110] axis. To maximize the mobilities of electrons and holes in the same IC requires regions with (100)-oriented silicon and (110)-oriented silicon in the substrate, known as hybrid orientation technology (HOT). Known methods of HOT include amorphization and templated recrystallization (ATR), in which regions to be reoriented receive an amorphization ion implant, followed by a recrystallization anneal. In one variation of ATR, in which recrystallization is performed before a shallow trench isolation (STI) process, discontinuities and defects (morphology) are introduced in a region approximately 100 nanometers wide at the lateral boundaries between (100)-oriented and (110)-oriented silicon. The morphology region is not suitable for MOS transistors, proscribing conventional ATR for use in circuits requiring high transistor density, such as SRAMs or logic gates. The morphology region also imposes unacceptable limits on transistor scaling. In another variation of ATR, in which recrystallization is performed after an STI process, stable defects are introduced at the STI boundaries which require anneals over 1250° C. to be eliminated. Such anneals after STI are incompatible with maintaining dimensional integrity of the substrate required for deep submicron lithography used in the 65 nanometer technology node and more advanced nodes.

SUMMARY

The need for a hybrid orientation technology (HOT) substrate compatible with deep submicron fabrication methods for complementary metal oxide semiconductor (CMOS) integrated circuits (ICs) is addressed by the instant invention, which provides a method of forming a HOT substrate which has two types of regions with different silicon crystal lattice orientations, (100)-oriented silicon and (110)-oriented silicon, for forming transistors, in order to optimize performance parameters, such as carrier mobility, for NMOS and PMOS transistors separately. The method starts with a commercially available directly bonded silicon (DSB) wafer, which includes a single crystal substrate wafer of (100)-oriented silicon with a DSB layer of (110)-oriented silicon formed on the top surface of the substrate wafer. Two amorphizing ion implants completely amorphize the DSB layer in NMOS regions, including the region near the top surface of the DSB layer. A silicon dioxide layer is formed on a top surface of the DSB wafer to prevent crystal defects during subsequent recrystallization and annealing. The silicon dioxide layer is formed at low temperature to prevent premature recrystallization during the silicon dioxide layer formation process. A solid phase epitaxial (SPE) process is performed in which (100)-oriented silicon is formed in the NMOS regions using the (100)-oriented silicon in the substrate wafer for a seed layer. Lateral spread of the boundary region between the DSB layer and the SPE layer is reduced by the complete amorphization of the near surface region in the NMOS regions. An integrated circuit formed using the inventive method is also claimed.

BRIEF DESCRIPTION OF THE DRAWINGS

FIGS. 1A-1G are cross-sectional views of an integrated circuit during fabrication of NMOS and PMOS transistors according to an embodiment of the instant invention.

DETAILED DESCRIPTION OF EXAMPLE EMBODIMENTS

Silicon crystal orientations are referred to herein using the nomenclature "(100)-oriented silicon" or "(110)-oriented silicon." Vectors or directions are referred to using the nomenclature "[100] direction" or "[110] vector."

The instant invention addresses the need for a robust and cost effective method of fabricating integrated circuits (ICs) with regions of different crystal lattice orientation, known as hybrid orientation technology (HOT), by providing a direct silicon bonded (DSB) substrate in which a DSB layer of (110)-oriented silicon is attached to a (100)-oriented silicon wafer, commonly called a substrate wafer, performing a double ion implant which completely amorphizes the DSB layer in n-channel metal oxide semiconductor (NMOS) transistor regions, forming an oxide layer on a top surface substrate, and recrystallizing the amorphized silicon in a solid phase epitaxial (SPE) process in which (100)-oriented silicon is formed in the NMOS regions using the (100)-oriented silicon in the substrate wafer as a seed layer. Lateral spread of the morphology region between the NMOS and p-channel metal oxide semiconductor (PMOS) transistor regions is reduced by the double amorphizing ion implants in the NMOS regions.

FIGS. 1A-1G illustrate steps in fabrication of NMOS and PMOS transistors according to an embodiment incorporating principles of the invention.

Figure 1A:
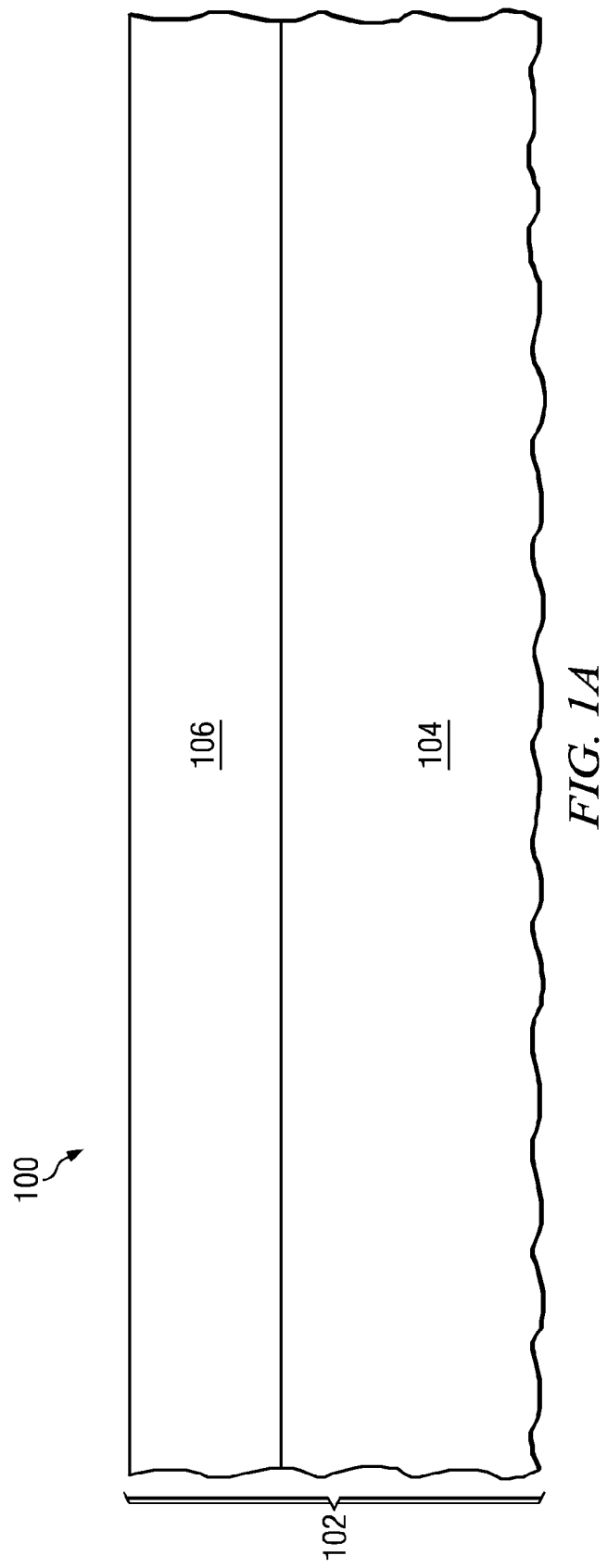

FIG. 1A shows an example IC 100 fabricated on a commercially available DBS wafer 102, which includes a (100)-oriented silicon substrate wafer 104, typically p-type, commonly 500 to 800 microns thick, and a (110)-oriented silicon DSB layer 106 directly bonded to the substrate wafer 104. The DSB layer 106 is typically 150 to 200 nanometers thick for IC fabrication, in order to situate an interface between the (110)-oriented silicon layer and the (100)-oriented silicon substrate wafer below a space charge region of a PMOS drain node under typical bias conditions, commonly less than 5 volts. A thickness of the DSB layer 106 may be reduced by known etching and/or polishing methods or increased by known epitaxial growth methods to attain a desired thickness for IC fabrication.

Figure 1B:
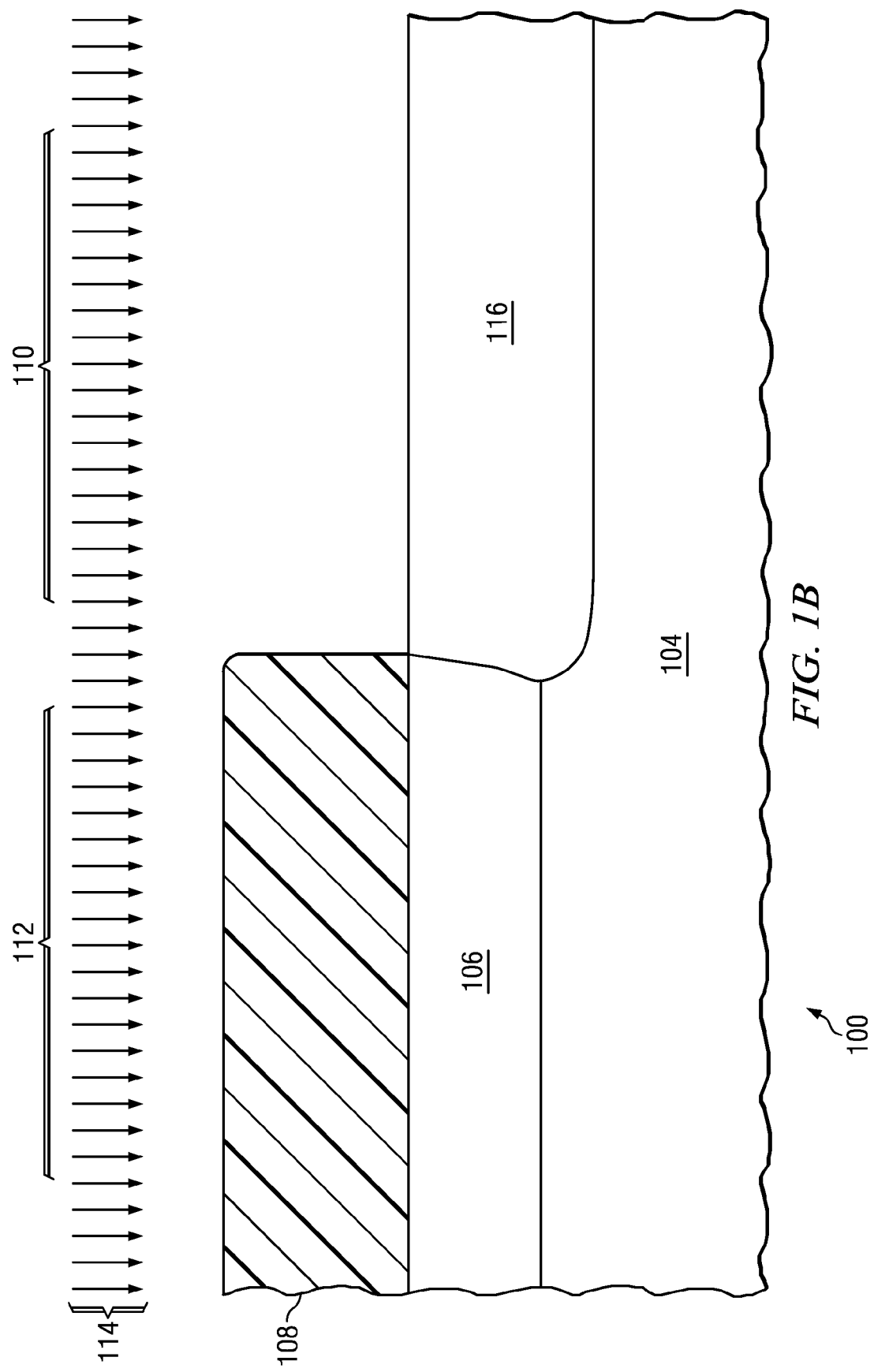

Referring to FIG. 1B, fabrication of the IC 100 continues with formation of an amorphization photoresist pattern 108 which exposes an n-channel MOS (NMOS) region 110 and covers a p-channel MOS (PMOS) region 112. A first amorphizing ion implant of a first amorphizing species 114 is performed in which the NMOS region is amorphized to a depth greater than the thickness of the DSB layer 106, preferably 50 to 100 nanometers deeper than the thickness of the DSB layer 106, to form a first NMOS amorphous region 116. The first amorphizing species 114 may be silicon, germanium, xenon, argon, or other species, preferably with an atomic mass greater than 27 and neither a donor or an acceptor electrically. A dose of the first amorphizing ion implant is preferably greater than $1 \times 10^{15}$ atoms/cm$^2$ to provide an adequate degree of amorphization at the desired depth, preferably 50 to 100 nanometers deeper than the thickness of the DSB layer 106. An ion energy of the first amorphizing ion implant may be determined by those familiar with ion implantation processes, using known methods, to attain an adequate degree of amorphization at the desired depth, preferably 50 to 100 nanometers deeper than the thickness of the DSB layer 106. In a preferred embodiment, the first amorphizing ion implant is tilted to reduce channeling of the first amorphizing species 114 along silicon crystal planes and improve uniformity of the first NMOS amorphous region 116. For example, a single implant tilted at 7 degrees will significantly reduce channeling. Similarly, an implant in four equal doses, in which each dose is tilted at 2 degrees and the tilt angle is rotated in 90 degree steps around a vertical axis will also significantly reduce channeling. The first amorphizing ion implant does not provide a uniform degree of amorphization throughout the first NMOS amorphous region 116. Regions of (110)-oriented crystalline silicon remain in the first NMOS amorphous region 116 within 50 nanometers of the top surface of the wafer 102. The first amorphizing species 114 is blocked from the PMOS region 112 by the amorphization photoresist pattern 108.

Figure 1C:
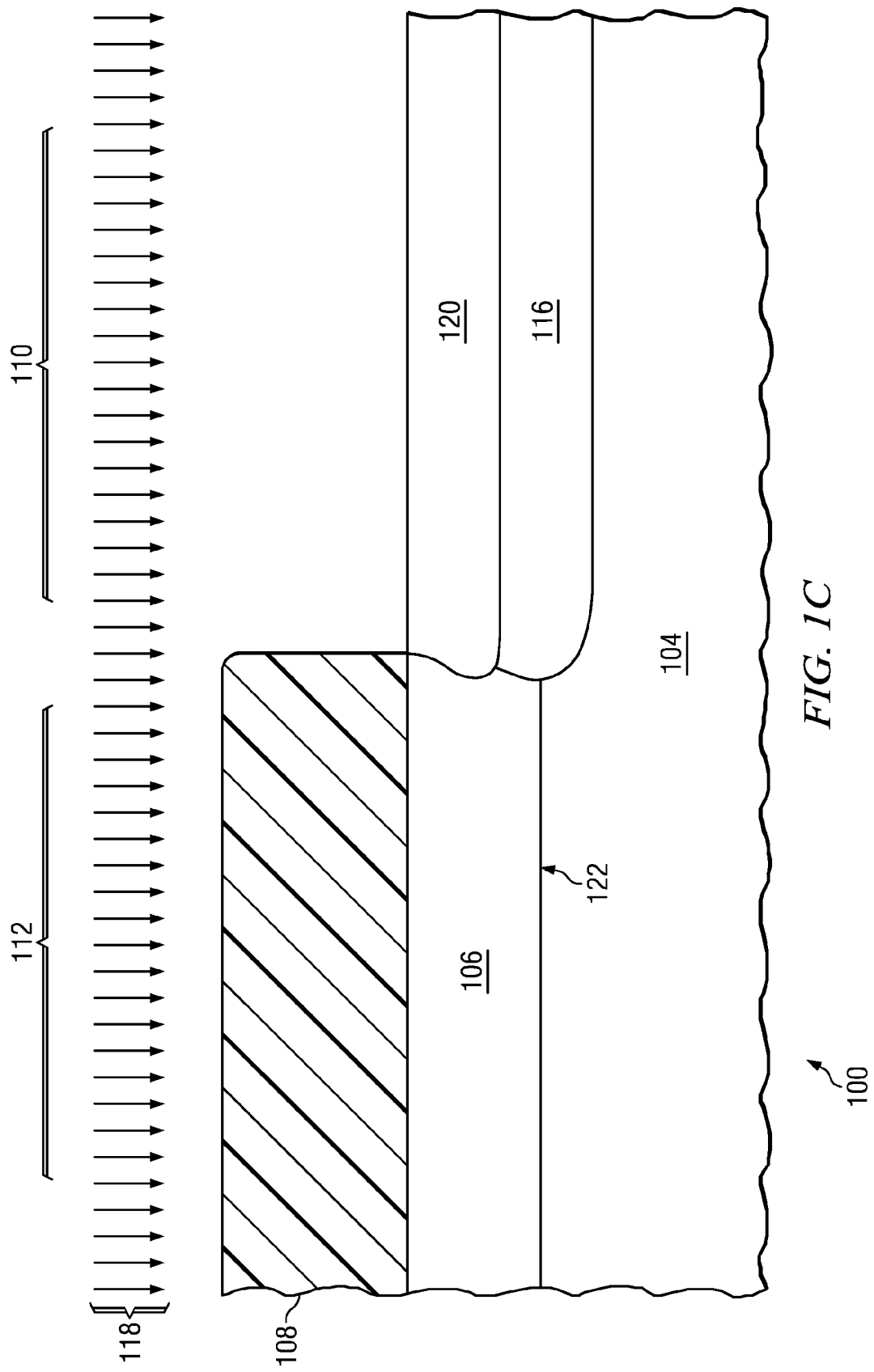

FIG. 1C depicts the IC 100 during a second amorphizing ion implant process, in which a second amorphizing species 118 is ion implanted into the NMOS region 110 to form a second NMOS amorphous region 120, which extends from the top surface of the IC 100 to a depth between one-half and one-fourth the depth of the first NMOS amorphous region 116. The second amorphizing species 118 may also be silicon, germanium, xenon, argon, or other species, and also preferably with an atomic mass greater than 27 and neither a donor or an acceptor electrically. A dose of the second amorphizing ion implant is similarly preferably greater than $1 \times 10^{15}$ atoms/cm$^2$ to substantially eliminate regions of (110)-oriented silicon at the desired depth, between one-half and one-fourth the depth of the first NMOS amorphous region 116. An ion energy of the second amorphizing ion implant may be determined by those familiar with ion implantation processes, using known methods, to attain an adequate degree of amorphization at the desired depth, between one-half and one-fourth the depth of the first NMOS amorphous region 116. In a preferred embodiment, the second amorphizing ion implant is also tilted to minimized channeling. The second amorphizing species 118 is blocked from the PMOS region 112 by the amorphization photoresist pattern 108.

In other embodiments, the thickness of the DSB layer may exceed 300 nanometers. Thicker DSB layers are advantageous because a first interface 122 between the substrate wafer and the DSB layer is a source of diffusion current to drains of transistors fabricated above the first interface 122 and increasing the thickness of the DSB layer desirably reduces the diffusion current in the drain nodes. In such embodiments, regions of (110)-oriented silicon may remain after the second amorphizing ion implant process, due to the limited amorphizing range of each implant. In such cases, a third amorphizing ion implant process is advantageous in that substantially complete elimination of regions of (110)-oriented silicon may be achieved by selecting energies of the three amorphizing implants to cover a desired depth of an NMOS amorphous region.

The amorphization photoresist pattern 108 is removed after the amorphizing ion implantation processes are completed, typically by exposure to an oxygen containing plasma followed by a wet chemical clean in a reducing solution, such as a mixture of ammonium hydroxide and hydrogen peroxide.

Referring to FIG. 1D, fabrication of the IC 100 continues with formation of a low temperature silicon dioxide layer 124 on top surfaces of the DSB layer 106 and the first and second NMOS amorphous regions, which are designated as a combined NMOS amorphous region 126. The low temperature silicon dioxide layer 124 is 10 to 30 nanometers thick, and is formed in a manner which does not cause any recrystallization of amorphous silicon in the combined NMOS amorphous region 126. Stoichiometry of the low temperature silicon dioxide layer 124 and adhesion to the top surfaces of the DSB layer 106 and the combined NMOS amorphous region 126 must be such that crystalline defects are prevented during subsequent recrystallization of the combined NMOS amorphous region 126 in a later process step. In one embodiment, the low temperature silicon dioxide layer 124 is deposited by plasma enhanced chemical vapor deposition (PECVD) at 390 to 410 C, using known methods. Silicon dioxide deposited under these conditions meets the requirements listed above. In another embodiment, a suitable low temperature silicon dioxide layer 124 may be formed by adding 2 to 10 percent $O_2$ to an $N_2$ ambient during a temperature ramp in a furnace in which the recrystallization of the combined NMOS amorphous region 126 is performed. It is within the scope of the instant invention to form the low temperature silicon dioxide layer 124 using other processes than those recited here.

FIG. 1E depicts the IC 100 at a further stage of fabrication. The combined NMOS amorphous region 126 is recrystallized during a solid phase epitaxy (SPE) process to form a (100)-oriented single crystal SPE layer 128, in which the (100)-oriented silicon of the substrate wafer 104 functions as a seed layer. A crystal lattice of the SPE layer 128 is aligned with a crystal lattice of the (100)-oriented substrate wafer 104. Additional amorphization of the region near the surface in the NMOS region 110 by the second amorphizing ion implant process is advantageous because undesired regrowth of (110)-oriented silicon in the combined NMOS amorphous region 126 during SPE is substantially eliminated. Furthermore, additional amorphization of the region near the surface in the NMOS region 110 by the second amorphizing ion implant process is advantageous because it reduces a lateral width of a second interface 130 between the (100)-oriented SPE layer 128 and the (110)-oriented DSB layer 106 to less than 40 nanometers.

A preferred embodiment of the SPE process includes heating the IC 100 at 590° C. to 610° C. in an $N_2$ ambient for 90 to 150 minutes. A third interface 132 between the substrate wafer 104 and the SPE layer 128 does not contribute a significant amount of diffusion current to MOS transistors fabricated above the third interface 132. Following the SPE process, the IC 100 is annealed to reduce crystal defects at the second interface 130 between the (100)-oriented SPE layer 128 and the (110)-oriented DSB layer 106. A preferred embodiment of the anneal process includes heating the IC at 1040° C. to 1060° C. in an $N_2$ ambient for 90 to 150 minutes.

The low temperature silicon dioxide layer 124 is removed during subsequent process steps.

Figure 1F:
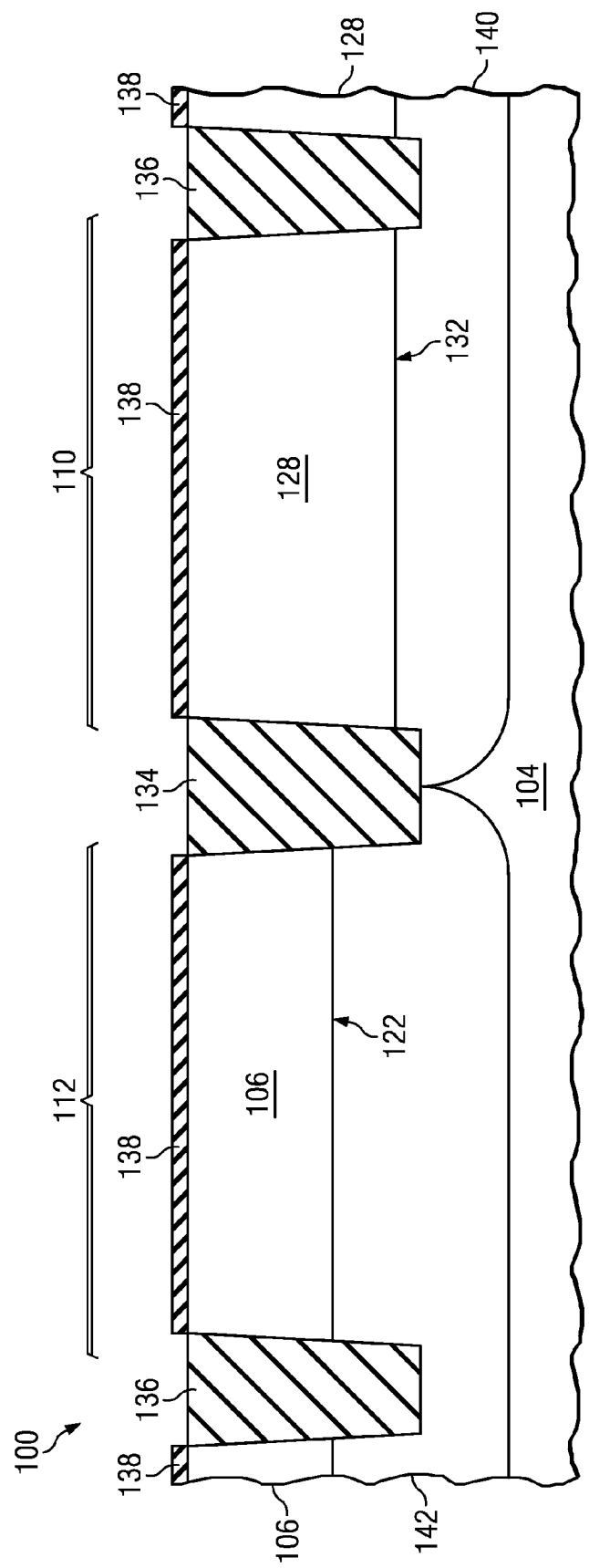

Referring to FIG. 1F, fabrication of the IC 100 continues with growth of an SPE sacrificial oxide layer, not shown in FIG. 1F, typically 5 to 15 nanometers of thermal oxide, to consume defects at the top surfaces of the substrate in the NMOS region 110 and the PMOS region 112. Regions of field oxide are formed by a shallow trench isolation (STI) process sequence, in which trenches, commonly 200 to 500 nanometers deep, are etched into the IC 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). In a preferred embodiment, the SPE sacrificial oxide layer is reused as a sacrificial pad oxide for the STI process. This is advantageous because reuse of the sacrificial oxide layer reduces an offset between the top surface of the NMOS region 110 and the top surface of the PMOS region 112, which results from a difference in oxidation rates between (110)-oriented silicon and (110)-oriented silicon. The lateral boundary region between the DSB layer 106 and the SPE layer 128 is occupied by a first field oxide region 134, providing an electrically passivated lateral boundary for the (100)-oriented layer 128 and the (110)-oriented layer 104. Additional regions of field oxide 136 are formed to electrically isolate components in the IC 100.

The configuration of (100)-oriented silicon in the NMOS region 110 and (110)-oriented silicon in the PMOS region 112 in the IC 100 forms an HOT substrate.

After formation of the field oxide 134, 136, a sacrificial oxide layer 138 is grown on the top surfaces of the NMOS region and the PMOS region to protect the surfaces during a subsequent well formation process sequence.

Still referring to FIG. 1F, fabrication of the IC 100 on the HOT substrate prepared according to the instant invention continues with formation of a p-type well 140 in the NMOS region 110 by known methods of ion implanting p-type dopants such as boron, BF2 or indium, commonly in several step with doses from $1 \times 10^{10}$ to $1 \times 10^{14}$ atoms/cm$^2$ at energies from 2 keV to 200 keV. Similarly, an n-type well 142 is formed in the PMOS region 112 by known methods of ion implanting n-type dopants such as phosphorus, arsenic or antimony, commonly in several step with doses from $1 \times 10^{10}$ to $1 \times 10^{14}$ atoms/cm$^2$ at energies from 1 keV to 500 keV.

Figure 1G:
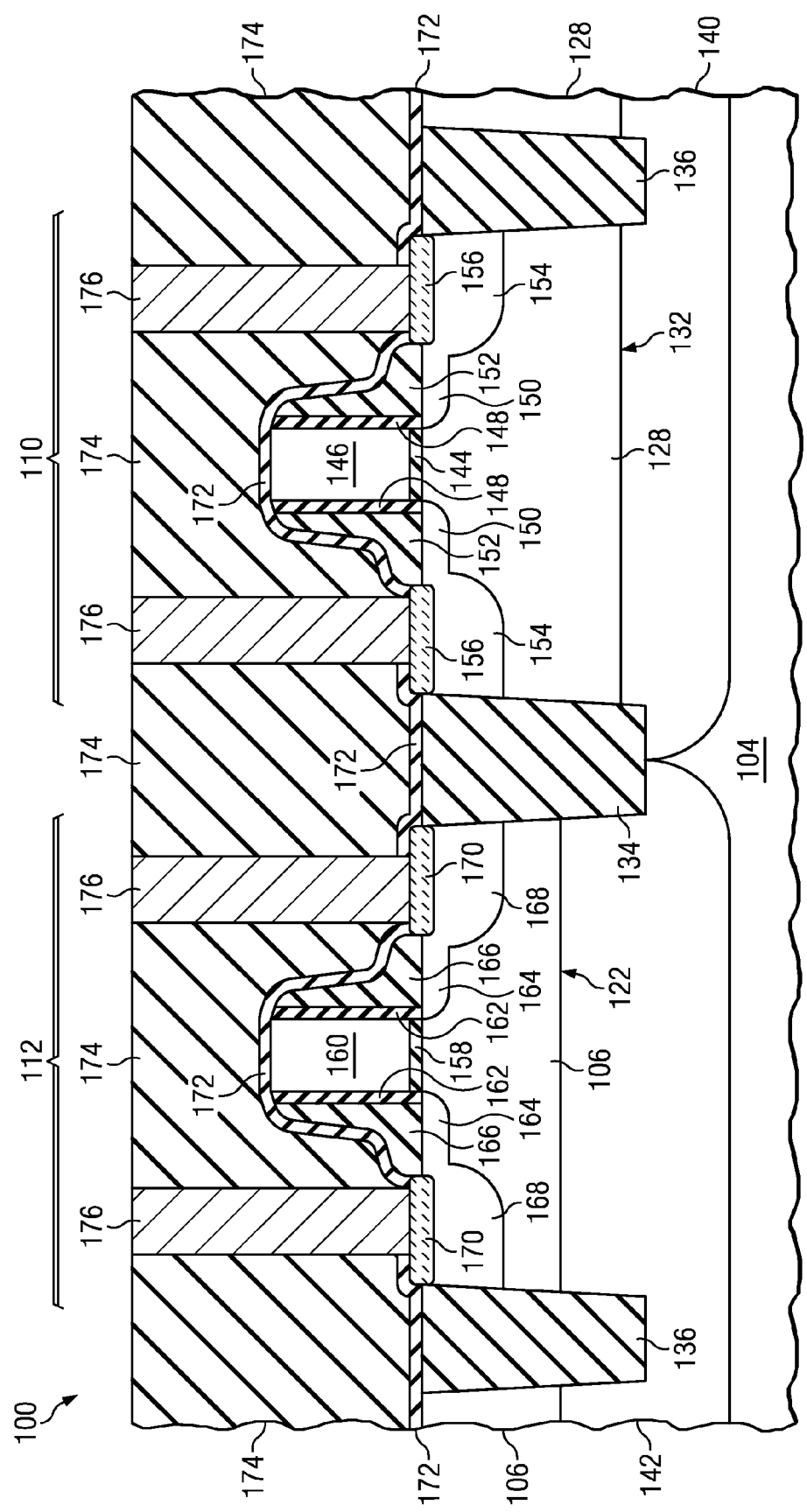

Referring to FIG. 1G, fabrication of the IC 100 continues with formation of an NMOS transistor, which proceeds with formation of an NMOS gate dielectric layer 144, typically silicon dioxide, nitrogen doped silicon dioxide, silicon oxy-nitride, hafnium oxide, layers of silicon dioxide and silicon nitride, or other insulating material, on a top surface of the p-type well 140, followed by formation of an NMOS gate 146, typically polycrystalline silicon, on a top surface of the NMOS gate dielectric layer 144, with NLDD offset spacers 148, typically one or more layers of silicon dioxide and/or silicon nitride formed by plasma etch, with a width from 1 to 30 nanometers, on lateral surfaces of the NMOS gate 146. N-type lightly doped drain regions (NLDD) 150 are formed in the p-type well 140 adjacent to the NMOS gate 146 by ion implantation of n-type dopants such as phosphorus, arsenic and/or antimony, commonly in several step with doses from $1 \times 10^{13}$ to $1 \times 10^{16}$ atoms/cm$^2$ at energies from 1 keV to 10 keV. Typical depths of n-type dopants in the NLDD 150 range from 5 to 50 nanometers. Following ion implantation of n-type dopants into the NLDD 150, NMOS gate sidewall spacers 152 are formed on lateral surfaces of the NLDD offset spacers 148, commonly by deposition of layers of silicon dioxide and silicon nitride spacer material followed by anisotropic etchback to remove spacer material from horizontal surfaces of the IC 100. Typical NMOS gate sidewall spacer widths range from 3 to 100 nanometers. Following formation of the NMOS gate sidewall spacers 152, NMOS source and drain regions (NSD) 154 are formed by in the p-type well 140 adjacent to the NMOS gate sidewall spacers 152 by ion implantation of n-type dopants such as phosphorus, arsenic and/or antimony, commonly in several step with doses from $1 \times 10^{14}$ to $1 \times 10^{16}$ atoms/cm$^2$ at energies from 3 keV to 50 keV. Typical depths of n-type dopants in the NSD 154 range from 10 to 250 nanometers. In a preferred embodiment, the thickness of the DSB layer 106 and the depth of the amorphous region formed by the amorphization ion implants are set so that the third interface 132 between the substrate wafer 104 and the SPE layer 128 is below a space charge region of the NSD 154. Anneals may be performed after the NLDD ion implants and the NSD ion implants to repair damage to the silicon lattice of the SPE layer 128 by the ion implantation processes. The p-type well 140, NMOS gate dielectric layer 144, NMOS gate 146, NLDD offset spacers 148, NLDD 150, NMOS gate sidewall spacers 152 and NSD 154 form an NMOS transistor. Layers of metal silicide 156 may be formed on top surfaces of the NSD 154 to decrease electrical resistance of contacts made to the NSD 154.

Still referring to FIG. 1G, fabrication of the IC 100 continues with formation of a PMOS transistor. A PMOS gate dielectric layer 158, typically silicon dioxide, nitrogen doped silicon dioxide, silicon oxy-nitride, hafnium oxide, layers of silicon dioxide and silicon nitride, or other insulating material, on a top surface of the n-type well 142, followed by formation of an PMOS gate 160, typically polycrystalline silicon, on a top surface of the PMOS gate dielectric layer 158, with PLDD offset spacers 162, typically one or more layers of silicon dioxide and/or silicon nitride formed by plasma etch, with a width from 1 to 30 nanometers, on lateral surfaces of the PMOS gate 160. P-type lightly doped drain regions (PLDD) 164 are formed in the n-type well 142 adjacent to the PMOS gate 160 by ion implantation of p-type dopants such as boron, BF2 and/or gallium, commonly in several step with doses from $1 \times 10^{13}$ to $1 \times 10^{16}$ atoms/cm$^2$ at energies from 0.3 keV to 10 keV. Typical depths of p-type dopants in the PLDD 164 range from 5 to 50 nanometers. Following ion implantation of p-type dopants into the PLDD 164, PMOS gate sidewall spacers 166 are formed on lateral surfaces of the PLDD offset spacers 162, commonly by deposition of layers of silicon dioxide and silicon nitride spacer material followed by anisotropic etchback to remove spacer material from horizontal surfaces of the IC 100. Typical PMOS gate sidewall spacer widths range from 3 to 100 nanometers. Following formation of the PMOS gate sidewall spacers 166, PMOS source and drain regions (PSD) 168 are formed by in the n-type well 142 adjacent to the PMOS gate sidewall spacers 166 by ion implantation of p-type dopants such as boron, BF2 and/or gallium, commonly in several step with doses from $1 \times 10^{14}$ to $1 \times 10^{16}$ atoms/cm$^2$ at energies from 3 keV to 50 keV. Typical depths of p-type dopants in the PSD 168 range from 10 to 250 nanometers. In a preferred embodiment, the thickness of the DSB layer 106 is adjusted so that the first interface 122 between the substrate wafer 104 and the DSB layer 106 is below a space charge region of the PSD 168. Anneals may be performed after the PLDD ion implants and the PSD ion implants to repair damage to the silicon lattice of the DSB layer 106 by the ion implantation processes. The n-type well 140, PMOS gate dielectric layer 158, PMOS gate 160, PLDD offset spacers 162, PLDD 164, PMOS gate sidewall spacers 166 and PSD 168 form a PMOS transistor. Layers of metal silicide 170 may be formed on top surfaces of the PSD 164 to decrease electrical resistance of contacts made to the PSD 164.

Still referring to FIG. 1G, fabrication of the IC 100 continues with formation of a pre-metal dielectric liner (PMD liner) 172, typically silicon nitride, 2 to 100 nanometer thick, on top surfaces of the NMOS transistor, the PMOS transistor and the field oxide 134, 136. In some embodiments, a dual stress layer (DSL) PMD liner is formed, which applies different levels of stress to different components in the IC, such as compressive stress on PMOS transistors and tensile stress on NMOS transistors. A pre-metal dielectric layer (PMD) 174, typically silicon dioxide, 152 to 1000 nanometers thick, is formed on a top surface of the PMD liner 172. Contacts 176 to the NSD 168 and PSD 154 are formed by etching holes in the PMD 174 and PMD liner 172 to expose portions of the top surfaces of the NSD 168 and PSD 154, and filling the holes with metals, typically tungsten. The contacts 176 allow electrical connections to be made to the NMOS and PMOS transistors.

The formation of the NMOS transistor in the SPE layer 128 is advantageous because the (100)-oriented silicon maximizes the electron mobility in an NMOS channel, and thus maximizes the NMOS on-state drive current. The formation of the PMOS transistor in the (110)-oriented silicon layer is advantageous because the (110)-oriented silicon maximizes the hole mobility in a PMOS channel, and thus maximizes the PMOS on-state drive current.

It is within the scope of this invention to form an IC on a DSB wafer made of a (110)-oriented substrate wafer with a (100)-oriented DSB layer, and generate a (110)-oriented SPE layer by the process sequence described above, and realize the same advantages with respect to maximization of on-state drive currents explained above.

The silicon crystal lattice orientations of the substrate wafer and DSB layer may be altered from the (100) and (110) orientations described in the embodiments above, to suit a particular application, for example a radiation resistant IC, and still fall within the scope of this invention. This invention generally discloses a method to obtain regions with two silicon crystal lattice orientations in a single substrate for electronic components, and is not limited to the (100) and (110) orientations, nor to transistors as the only components formed in the substrate.

Those skilled in the art to which the invention relates will appreciate that many other embodiments and modifications are possible within the scope of the claimed invention.

What is claimed is:

1. A method for forming an integrated circuit substrate, comprising the steps of:
   providing a single crystal substrate wafer, comprised of silicon with a first crystal lattice orientation;
   forming a directly bonded silicon (DSB) layer with a second crystal lattice orientation on a top surface of said substrate wafer;
   forming an amorphization photoresist pattern on a top surface of said DSB layer which exposes the top surface of said DSB layer in a region defined for recrystallization to said first crystal lattice orientation;
   performing a first amorphization ion implant process whereby a first amorphous layer is formed in said DSB layer and said substrate wafer in said region defined for recrystallization to said first crystal lattice orientation, with a depth greater than a thickness of said DSB layer;
   performing a second amorphization ion implant process whereby a second amorphous layer is formed in said DSB layer in said region defined for recrystallization to said first crystal lattice orientation, with a depth between one-half and one-fourth of said depth of said first amorphous layer;
   forming a low temperature silicon dioxide layer on a top surface of said DSB layer and said region defined for recrystallization to said first crystal lattice orientation;
   performing a solid phase epitaxy (SPE) process in which said first amorphous layer and said second amorphous layer are recrystallized to said first crystal lattice orientation, thereby forming an SPE layer;
   performing an anneal process in which defects at an interface between said SPE layer and said DSB layer are reduced;
   forming a sacrificial layer of silicon dioxide on the top surface of said DSB layer and a top surface of said SPE layer; and
   forming a region of field oxide at an interface between said SPE layer and said DSB layer.

2. The method of claim 1, in which crystal lattice discontinuities at an interface between said SPE layer and said DSB layer are contained in a zone less then 40 nanometers wide.

3. The method of claim 2, in which said first crystal lattice orientation is a (100) orientation; and said second crystal lattice orientation is a (110) orientation.

4. The method of claim 3, in which a thickness of said DSB layer is between 100 and 350 nanometers.

5. The method of claim 4, in which said first amorphization ion implant process comprises implanting silicon ions at a dose greater than $1 \times 10^{15}$ atoms/cm$^2$; and said second amorphization ion implant process comprises implanting silicon ions at a dose greater than $1 \times 10^{15}$ atoms/cm$^2$.

6. The method of claim 5, in which said step of performing a SPE process further comprises heating said first amorphous layer and said second amorphous layer at 690° C. to 610° C. for 90 to 150 minutes in an $N_2$ ambient; and said step of performing an anneal process further comprises heating said SPE layer and said DSB layer at 1040° C. to 1060° C. for 90 to 150 minutes in an $N_2$ ambient.

7. The method of claim 6, further comprising the step of performing a third amorphization ion implant process whereby a third amorphous layer is formed in said DSB layer in said region defined for recrystallization to said first crystal lattice orientation, with a depth between one-half and one-fourth of said depth of said second amorphous layer.

8. A method for forming an integrated circuit comprising the steps of:
   providing a single crystal substrate wafer, comprised of silicon with a first crystal lattice orientation;
   forming a directly bonded silicon (DSB) layer with a second crystal lattice orientation on a top surface of said substrate wafer;
   forming an amorphization photoresist pattern on a top surface of said DSB layer which exposes the top surface of said DSB layer in a region defined for recrystallization to said first crystal lattice orientation;
   performing a first amorphization ion implant process whereby a first amorphous layer is formed in said DSB layer and said substrate wafer in said region defined for recrystallization to said first crystal lattice orientation, with a depth greater than a thickness of said DSB layer;
   performing a second amorphization ion implant process whereby a second amorphous layer is formed in said DSB layer in said region defined for recrystallization to said first crystal lattice orientation, with a depth between one-half and one-fourth of said depth of said first amorphous layer;

forming a low temperature silicon dioxide layer on a top surface of said DSB layer and said region defined for recrystallization to said first crystal lattice orientation;

performing a solid phase epitaxy (SPE) process in which said first amorphous layer and said second amorphous layer are recrystallized to said first crystal lattice orientation, thereby forming an SPE layer;

performing an anneal process in which defects at an interface between said SPE layer and said DSB layer are reduced;

forming a sacrificial layer of silicon dioxide on the top surface of said DSB layer and a top surface of said SPE layer;

forming a region of field oxide at an interface between said SPE layer and said DSB layer;

forming a first well of a first electrical type in said SPE layer by ion implanting a first set of dopants of said first electrical type;

forming a second well of a second electrical type in said DSB layer by ion implanting a second set of dopants of said second electrical type;

forming a first MOS transistor in said first well by a process further comprising the steps of:
  forming a first gate dielectric layer on a top surface of said first well;
  forming a first gate on a top surface of said first gate dielectric layer;
  forming a first set of lightly doped drain (LDD) offset spacers on lateral surfaces of said first gate;
  forming a first set of LDD regions of said second electrical type in said first well adjacent to said first gate by ion implanting a second set of said second type of dopants;
  forming a first set of gate sidewall spacers on lateral surfaces of said first set of LDD offset spacers; and
  forming a first set of source and drain (SD) regions of said second electrical type in said first well adjacent to said first set of gate sidewall spacers by ion implanting a third set of said second type of dopants;

forming a second MOS transistor in said second well by a process further comprising the steps of:
  forming a second gate dielectric layer on a top surface of said second well;
  forming a second gate on a top surface of said second gate dielectric layer;
  forming a second set of LDD offset spacers on lateral surfaces of said second gate;
  forming a second set of LDD regions of said first electrical type in said second well adjacent to said second gate by ion implanting a second set of said first type of dopants;
  forming a second set of gate sidewall spacers on lateral surfaces of said second set of LDD offset spacers; and
  forming a second set of SD regions of said first electrical type in said second well adjacent to said second set of gate sidewall spacers by ion implanting a third set of said first type of dopants;

forming a PMD liner on top surfaces of said first transistor, said second transistor and said field oxide region;

forming a PMD layer on a top surface of said PMD liner; and forming contacts in said PMD layer and said PMD liner to make electrical connections to said first set of SD regions and said second set of SD regions.

9. The method of claim 8, in which crystal lattice discontinuities at an interface between said SPE layer and said DSB layer are contained in a zone less then 40 nanometers wide.

10. The method of claim 9, wherein said first crystal lattice orientation is a (100) orientation; said second crystal lattice orientation is a (110) orientation; said first electrical type is p-type; said second electrical type is n-type; said first MOS transistor is an n-channel MOS transistor; and said second MOS transistor is a p-channel MOS transistor.

11. The method of claim 10, in which a thickness of said DSB layer is between 100 and 350 nanometers.

12. The method of claim 11, wherein said first amorphization ion implant process comprises implanting silicon ions at a dose greater than $1 \times 10^{15}$ atoms/cm$^2$; and said second amorphization ion implant process comprises implanting silicon ions at a dose greater than $1 \times 10^{15}$ atoms/cm$^2$.

13. The method of claim 12, wherein said step of performing a SPE process further comprises heating said first amorphous layer and said second amorphous layer at 690° C. to 610° C. for 90 to 150 minutes in an N$_2$ ambient; and said step of performing an anneal process further comprises heating said SPE layer and said DSB layer at 1040° C. to 1060° C. for 90 to 150 minutes in an N$_2$ ambient.

14. The method of claim 13, further comprising the step of performing a third amorphization ion implant process whereby a third amorphous layer is formed in said DSB layer in said region defined for recrystallization to said first crystal lattice orientation, with a depth between one-half and one-fourth of said depth of said second amorphous layer.

15. An integrated circuit (IC) comprising:
  a single crystal substrate wafer, comprised of silicon with a first crystal lattice orientation;
  a directly bonded silicon (DSB) layer with a second crystal lattice orientation formed on a top surface of said substrate wafer;
  a solid phase epitaxy (SPE) layer of said first crystal lattice orientation, formed in said DSB layer and connecting to said substrate wafer by an SPE process;
  a region of field oxide formed at an interface between said SPE layer and said DSB layer;
  a first well of a first electrical type formed in said SPE layer by ion implanting a first set of dopants of said first electrical type;
  a second well of a second electrical type formed in said DSB layer by ion implanting a second set of dopants of said second electrical type;
  a first MOS transistor formed in said first well, further comprising:
    a first gate dielectric layer formed on a top surface of said first well;
    a first gate formed on a top surface of said first gate dielectric layer;
    a first set of lightly doped drain (LDD) offset spacers formed on lateral surfaces of said first gate;
    a first set of LDD regions of said second electrical type formed in said first well adjacent to said first gate by ion implanting a second set of said second type of dopants;
    a first set of gate sidewall spacers formed on lateral surfaces of said first set of LDD offset spacers; and
    a first set of source and drain (SD) regions of said second electrical type formed in said first well adjacent to said first set of gate sidewall spacers by ion implanting a third set of said second type of dopants;
  a second MOS transistor formed in said second well, further comprising:
    a second gate dielectric layer formed on a top surface of said second well;
    a second gate formed on a top surface of said second gate dielectric layer;

a second set of LDD offset spacers formed on lateral surfaces of said second gate;

a second set of LDD regions of said first electrical type formed in said second well adjacent to said second gate by ion implanting a second set of said first type of dopants;

a second set of gate sidewall spacers formed on lateral surfaces of said second set of LDD offset spacers; and a second set of SD regions of said first electrical type formed in said second well adjacent to said second set of gate sidewall spacers by ion implanting a third set of said first type of dopants;

a PMD liner formed on top surfaces of said first transistor, said second transistor and said field oxide region;

a PMD layer formed on a top surface of said PMD liner; and contacts formed in said PMD layer and said PMD liner to make electrical connections to said first set of SD regions and said second set of SD regions.

16. The IC of claim 15, wherein crystal lattice discontinuities at an interface between said SPE layer and said DSB layer are contained in a zone less then 40 nanometers wide.

17. The IC of claim 16, wherein a thickness of said DSB layer is between 100 and 350 nanometers.

18. The IC of claim 17, wherein said first crystal lattice orientation is a (100) orientation; said second crystal lattice orientation is a (110) orientation; said first electrical type is p-type; said second electrical type is n-type; said first MOS transistor is an n-channel MOS transistor; and said second MOS transistor is a p-channel MOS transistor.

19. The IC of claim 17, wherein said first crystal lattice orientation is a (110) orientation; said second crystal lattice orientation is a (100) orientation; said first electrical type is n-type; said second electrical type is p-type; said first MOS transistor is a p-channel MOS transistor; and said second MOS transistor is an n-channel MOS transistor.

* * * * *